US008663784B2

(12) United States Patent  
Gopalan et al.

(10) Patent No.: US 8,663,784 B2
(45) Date of Patent: Mar. 4, 2014

(54) PHOTOPATTERNABLE IMAGING LAYERS FOR CONTROLLING BLOCK COPOLYMER MICRODOMAIN ORIENTATION

(71) Applicant: Wisconsin Alumni Research Foundation, Madison, WI (US)

(72) Inventors: Padma Gopalan, Madison, WI (US); Eungnak Han, Hillsboro, OR (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 13/659,824

(22) Filed: Oct. 24, 2012

(65) Prior Publication Data

US 2013/0059130 A1    Mar. 7, 2013

Related U.S. Application Data

(62) Division of application No. 12/273,987, filed on Nov. 19, 2008, now Pat. No. 8,362,179.

(51) Int. Cl.
- *B32B 3/10* (2006.01)
- *B32B 33/00* (2006.01)
- *B05D 3/06* (2006.01)
- *B32B 27/08* (2006.01)

(52) U.S. Cl.
USPC .......................... 428/195.1; 427/508; 427/510

(58) Field of Classification Search
USPC ................ 428/195.1; 427/508, 510
See application file for complete search history.

(56) References Cited

U.S. PATENT DOCUMENTS

| 7,521,090 | B1 | 4/2009 | Chen et al. |
| 8,083,953 | B2* | 12/2011 | Millward et al. ................. 216/2 |
| 8,362,179 | B2 | 1/2013 | Gopalan et al. |
| 2005/0027071 | A1 | 2/2005 | Deeter et al. |
| 2005/0215746 | A1 | 9/2005 | DeSimone et al. |
| 2009/0186234 | A1* | 7/2009 | Colburn et al. ............... 428/500 |
| 2010/0124629 | A1 | 5/2010 | Gopalan et al. |

OTHER PUBLICATIONS

Eungnak Han et al. Adv. Mater. 2007, 19, 4448-4452.*
Polymer Source Online Store, archived webpage accessed from Internet Archives (WayBackMachine), located at http://web.archive.org/web/20071126040416/http://www.polymersource.com/shoppingCart/browse.asp?ID=27, pp. 1-3 (webpage accessed), p. 4 (webpage indicating link 8.1.42 is not archived), Nov. 26, 2007.
Webpage at https://www.securewebexchange.com/polymersource.com/product.php?ID=1026, material accessed on Mar. 12, 2012, 1 page.
Material Safety Data Sheet for "Random Copolymer Poly(styrene-co-methyl meththacrylate-co-gylycidyl methacrylate)," Polymer Source, Inc., issued Mar. 14, 2008, accessed from link on https://www.securewebexchange.com/polymersource.com/product.php?ID=1026 (Reference No. 2), pp. 1-3.

(Continued)

*Primary Examiner* — Vu A Nguyen
(74) *Attorney, Agent, or Firm* — Weaver Austin Villeneuve & Sampson LLP

(57) ABSTRACT

The present invention provides structures including a substrate, a crosslinked polymer film disposed over the substrate, and a patterned diblock copolymer film disposed over the crosslinked polymer film. The crosslinked polymer comprises a random copolymer polymerized from a first monomer, a second monomer, and a photo-crosslinkable and/or thermally crosslinkable third monomer, including epoxy-functional or acrylyol-functional monomers. Also disclosed are methods for forming the structures.

23 Claims, 8 Drawing Sheets

(56) References Cited

OTHER PUBLICATIONS

Han, E. et al., "Effect of Composition of Substrate-Modifying Random Copolymers on the Orientation of Symmetric and Asymmetric Diblock Copolymer Domains," *Macromolecules*, vol. 41, No. 23, pp. 9090-9097, 2008, published by American Chemical Society.

Han, E. et al., "Photopatternable Imaging Layers for Controlling Block Copolymer Microdomain Orientation," *Advanced Materials*, vol. 19, pp. 4448-4452, 2007; published by Wiley-VCH Verlag GmbH & Co. KGaA, Weinheim.

Segalman, R. A., et al., Graphoepitaxy of Spherical Domain Block Copolymer Films, *Adv. Mater.*, vol. 13, No. 15, Aug. 3, 2001; published by Wiley-VCH Verlag GmbH, D-69469 Weinhelm.

Sundrani, D. et al., "Guiding Polymers to Perfection: Macroscopic Alignment of Nanoscale Domains," *Nano Letters*, vol. 4, No. 2, pp. 273-276, 2004; Published by American Chemical Society.

Kim, S. O. et al., "Epitaxial Self-Assembly of Block Copolymers on Lithographically Defined Nanopatterned Substrates," *Nature*, vol. 424, pp. 411-414, Jul. 24, 2003, published by Nature Publishing Group.

Stoykovich, M. P., et al., "Directed Assembly of Block Copolymer Blends into Nonregular Device-Oriented Structures," *Science*, vol. 308, pp. 1442-1446, Jun. 3, 2005.

Stoykovich, M. P. et al., "Block Copolymers and Conventional Lithography," *Materials Today*, vol. 9, No. 9, pp. 20-29, 2006.

Thurn-Albrecht, T. et al., "Nanoscopic Templates from Oriented Block Copolymer Films," Adv. Mater., vol. 12, No. 11, pp. 787-791, 2000; published by Wiley-VCH Vertag GmbH, D-69469 Weinheim.

Pitois, C. et al., "Low-Loss Passive Optical Waveguides Based on Photosensitive Poly(pentafluorostyrene-co-glycidyl methacrylate)," *Macromolecules*, vol. 32. pp. 2003-2009, 1999; published by American Chemical Society.

In, I. et al, "Side-Chain-Grafted Random Copolymer Brushes as Neutral Surfaces for Controlling the Orientation of Block Copolymer Microdomains in Thin Films," Langmuir, vol. 22, pp. 7855-7860, 2006, published by American Chemical Society.

Bang, J. et al., "Facile Routes to Patterned Surface Neuralization Layers for Block Copolymer Lithography," *Adv. Mater.*, vol. 19, pp. 4552-4557, 2007; published by Wiley-VCH Verlag GmbH & Co. KgaA, Weinheim.

Ryu, D. Y. et al., "A generalized Approach to the Modification of Solid Surfaces," *Science*, vol. 308, pp. 236-239, Apr. 8, 2005.

Mansky, P. et al., "Controlling Polymer-Surface Interactions with Random Copolymer Brushes," *Science*, vol. 275, pp. 1458-1460, Mar. 7, 1997.

Liu, C., et al., "Pattern transfer Using Poly(styrene-block-methyl methacrylate) Copolymer Films and Reactive Ion Etching," *J. Vac. Sci. Technol. B*, vol. 25, No. 6, pp. 1963-1968, Nov./Dec. 2007; published by American Vacuum Society.

Gopalan, P. et al., Abstract Entitled, "Photo-patternable Imaging Layers for Controlling Block Copolymer Microdomain Orientation," presented at Symposium Q: Advances in Photo-Initiated Polymer Processes and Materials, Apr. 10-12, 2007; published on-line at http://www.mrs.org/s_mrs/doc.asp?CID-8697&DID=193944.

Edwards, E. W. et al., "Precise Control over Molecular Dimensions of Block-Copolymer Domains Using the Interfacial Energy of Chemically Nanopatterned Substrates," *Advanced Materials*, vol. 16, No. 15, pp. 1315-1319, 2004.

Xu, T. et al., "Interfacial Interaction Dependence of Microdomain Orientation in Diblock Copolymer Thin Films," *Macromolecules*, vol. 38, No. 7, pp. 2802-2805, 2005; published by American Chemical Society.

Jeong, U. et al., "Enhancement in the Orientation of the Microdomain in Block Copolymer Thin Films upon the Addition of Homopolymer," *Advanced Materials*, vol. 16, No. 6, pp. 533-536, 2004.

Ham, S. et al., "Microdomain Orientation of PS-*b*-PMMA by Controlled Interfacial Interactions," *Macromolecules*, 2008, vol. 41, pp. 6431-3437; published on Web Aug. 6, 2008 and by American Chemical Society.

Guarini, K.W., et al.m "Optimization of Diblock Copolymer Thin Film Self Assembly," *Adv. Mater.*, vol. 14, No. 18, pp. 1290-1294, Sep. 16, 2002.

Ghani, M. A., et al., "Multi-armed, TEMPO-functionalized Unimolecular Initiators for Starbust Dendrimer Synthesis Via Stable Free Radical Polymerization, 2. Tris (1,3,5)benzyloxy unimers," *Canadian Journal of Chemistry*, vol. 82, No. 9, pp. 1403-1412, 2004.

Benoit, D. et al., "Development of a Universal Alkoxyamine for "Living" Free Radical Polymerizations," *J. Am Chem. Soc.*, vol. 121, No. 16, pp. 3904-3920, 1999.

Office Action mailed Dec. 12, 2011, issued in U.S. Appl. No. 12/273,987.

Final Office Action mailed May 7, 2012, issued in U.S. Appl. No. 12/273,987.

Notice of Allowance mailed Jul. 18, 2012, issued in U.S. Appl. No. 12/273,987.

Han, E. et al., Cross-linked Random Copolymers Mats as Ultrathin Nonpreferential Layers for Block Copolymers Self-Assembly, Langmuir, 2010, vol. 26, No. 2, pp. 1311-1315.

\* cited by examiner

US 8,663,784 B2

PHOTOPATTERNABLE IMAGING LAYERS FOR CONTROLLING BLOCK COPOLYMER MICRODOMAIN ORIENTATION

CROSS-REFERENCE TO RELATED APPLICATIONS

This application is a divisional of and claims priority to U.S. application Ser. No. 12/273,987, titled, "PHOTOPATTERNABLE IMAGING LAYERS FOR CONTROLLING BLOCK COPOLYMER MICRODOMAIN ORIENTATION," filed Nov. 19, 2008, all of which is incorporated herein by this reference for all purposes.

STATEMENT OF GOVERNMENTAL SUPPORT

This invention was made with government support under 0425880 awarded by the National Science Foundation. The government has certain rights in the invention.

FIELD OF INVENTION

The present invention relates to structures comprising a crosslinked polymer film disposed over a substrate and a patterned diblock copolymer film disposed over the crosslinked polymer film. The structures are well-suited for use in bottom-up microelectronic device fabrication.

BACKGROUND OF THE INVENTION

Block copolymer (BCP) lithography has emerged as a promising tool to create highly regular and dense dot or line arrays at sub 50 nm length scales. Block copolymer lithography refers to the use of self-assembled domain structures, typically spheres, cylinders, and lamellas in the form of a thin film as a template for the addition and subtraction nanofabrication processes. Two pattern geometries have been studied, dense arrays of dots and dense arrays of lines and spaces. The former can be generated from sphere-forming BCP or from cylinder-forming BCP with domains oriented perpendicular to the substrate, and the latter from cylinder-forming BCP with domains oriented parallel to the substrate or lamella forming BCP with domains oriented vertically to the substrate. Controlling the orientation of the domains on the substrate is critical for useful BCP arrays. Once formed, one of the copolymers is selectively etched away, leaving a transferable pattern. Periodic BCP arrays find use in the fabrication of a variety of microelectronic devices such as magnetic storage media, quantum dot arrays, photonic crystals, photovoltaic cells, and nanowire transistors.

Lamella and cylinders that are oriented perpendicular to the underlying substrate may have advantages in pattern transfer over spheres or parallel cylinders because of the higher aspect ratio of the resulting template and the vertical side-walls. The perpendicular alignment of block copolymer domains in thin films can be controlled by directional fields such as solvent evaporation, electric fields, or directional crystallization. Physical constraints (topography), and chemical patterns can also control the domain orientation. Of these approaches, chemical modification of the substrate is often used to induce perpendicular domain orientation. For example, the substrate can be chemically modified by self assembled monolayer (SAM). SAM of alkylthiols (on gold) or alkylsiloxanes (on Si/SiO$_2$) with polar or non-polar terminal groups have been utilized to modify the substrate. Furthermore, exposure to different doses of X-ray in the presence of oxygen can alter the polarity and hence the wetting behavior of the SAMs resulting in a symmetric, neutral or asymmetric wetting layer.

Random copolymer brushes are also used for chemical modification. Brushes are thin polymer layers in which each chain is chemically grafted to a surface. For example, brushes with hydroxyl groups that attach to silicon oxide surfaces through condensation reactions are a class of surface-modifying layers. Mansky, P.; Liu, Y.; Huang, E.; Russell, T. P.; Hawker, C. *Science* 1997, 275 (5305), 1458-1460. In, I.; La, Y. H.; Park, S. M.; Nealey, P. F.; Gopalan, P. *Langmuir*, 2006, 22, 7855-7860. Although such brushes are useful for modifying hydroxyl-rich surfaces, many substrates such as metals and polymers may not have a sufficient density of surface hydroxyl groups.

SUMMARY OF THE INVENTION

The present invention provides block copolymer structures and methods of making the structures. The structures include a substrate, a crosslinked polymer film disposed over the substrate, and a patterned diblock copolymer film disposed over the crosslinked polymer film. The crosslinked polymer comprises a random copolymer polymerized from three monomers, at least one of which is photo-crosslinkable and/or thermally crosslinkable. Unlike conventional BCP structures and related methods, the crosslinked polymer films of the disclosed structures are substrate independent and do not require high temperatures to induce crosslinking The disclosed crosslinked polymer films can be ultra-thin (e.g., 2-6 nm), which facilitates pattern transfer in bottom-up microelectronic device fabrication. Finally, the use of photo-crosslinkable monomers permits the photo-patterning of alternate regions of preferential and neutral wetting on the substrate by inducing crosslinking of the random copolymer only in those regions exposed to light.

The disclosed structures include a crosslinked polymer film disposed over: substrate. The crosslinked polymer comprises a random copolymer polymerized from a first monomer, a second monomer, and a third, photo-crosslinkable and/or thermally-crosslinkable monomer. Exemplary first, second, and third monomers are disclosed herein. In some embodiments, the first and second monomers are styrene and methyl methacrylate and the third monomer is an epoxy-functional or an acryloyl-functional monomer. The relative amounts of the monomers in the random copolymer may vary. Similarly, the crosslinking density of the random copolymer and the thickness of the crosslinked polymer film may vary. In some embodiments, the crosslinked polymer film has a thickness of no greater than about 8 nm. In other embodiments, the random copolymer has a crosslinking density of at least about 1%. In yet other embodiments, the first monomer comprises styrene and the styrene fraction of the crosslinked polymer ranges from about 0.48 to about 0.76.

The structures also include a diblock copolymer film disposed over the crosslinked polymer film. The diblock copolymer film defines a pattern, which is produced by the self-assembly of the diblock copolymer induced by the underlying crosslinked polymer film. In some embodiments, the pattern comprises domains oriented perpendicular with respect to the surface of the substrate. The domains may comprise cylinders or lamellae, although other molecular structures are possible. Exemplary diblock copolymers are disclosed herein, including polystyrene-polymethyl methacrylate.

Exemplary substrates for the structures are disclosed herein. Similarly, methods for forming the structures are disclosed.

DETAILED DESCRIPTION

Figure 1:
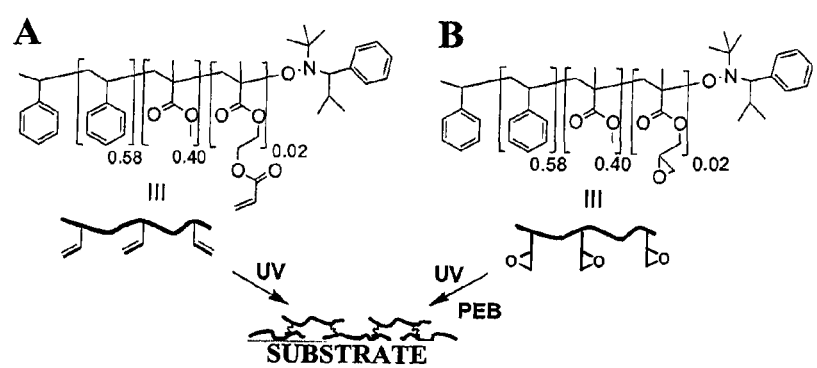
FIG. 1 shows a schematic representation of (A) the self-photo-crosslinking of acryloyl containing side-chain random copolymer PA2 (defined in the Examples) and (B) the self-photo-crosslinking of glycidyl group containing side-chain random copolymer PG2 (defined in the Examples).

The diblock copolymer structures disclosed herein comprise a substrate, a crosslinked polymer film disposed over the substrate, and a patterned diblock copolymer film disposed over the crosslinked polymer film. The crosslinked polymer film comprises a random copolymer polymerized from a first monomer, a second monomer, and a third monomer. In some embodiments, the first monomer comprises styrene. In some embodiments, the second monomer comprises methyl methacrylate. In some embodiments, the third monomer is a photo-crosslinkable monomer, a thermally-crosslinkable monomer, or both. In some such embodiments, the third monomer is an epoxy-functional monomer. As demonstrated in the Examples below, UV light is capable of inducing the crosslinking of epoxy groups in a random copolymer comprising epoxy-functional monomers. Heat is also capable of inducing the crosslinking of epoxy groups. A non-limiting example of an epoxy-functional monomer is glycidyl methacrylate. In other embodiments, the third monomer is an acryloyl-functionalized monomer. As with epoxy groups, UV light is capable of inducing the crosslinking of acryloyl-functional groups in a random copolymer comprising acryloylfunctional monomers. As discussed in Example 1, esterification of hydroxyethylmethacrylate (HEMA) with acryloyl chloride may be used to provide an acryloyl-crosslinkable group.

The properties of the crosslinked polymer film may vary. For example, the thickness of the crosslinked polymer film may vary. In some embodiments, the thickness of the crosslinked polymer film ranges from about 2 nm to about 20 nm, from about 2 nm to about 15 nm, from about 2 nm to about 10 nm, and from about 2 nm to about 8 nm. This includes embodiments where the crosslinked polymer film has a thickness no greater than about 3 nm, 4 nm, 5 nm, nm, or 7 nm. However, other thicknesses are possible. It is noted that very thin crosslinked polymer films (e.g., 2 nm) may be prepared by using higher crosslinking densities of the random copolymer film (e.g., 4%). As discussed above, ultra-thin (e.g., 2-6 nm) crosslinked polymer films are useful for effective pattern transfer. The Examples below describe how the experimental conditions may be adjusted to obtain varying thickness of the crosslinked polymer film.

Similarly, the crosslinking density of the random copolymer used to form the crosslinked polymer film may vary. The phrase "crosslinking density" refers to the mole % of crosslinkable groups in the random copolymer based on feed ration. In some embodiments, the crosslinking density ranges from about 1% to about 5%. This includes embodiments where the crosslinking density is 2%, 3%, and 4%.

As demonstrated in the Examples below, adjusting the stryene fraction provides control over the pattern produced in the diblock copolymer film. The ratio of the monomers in the random copolymer, and thus, in the crosslinked polymer film may vary. By way of example only, for crosslinked polymers formed from a random copolymer comprising a styrene monomer, the styrene fraction may vary. In some embodiments, the styrene fraction varies from about 0.40 to about 0.80. This includes embodiments in which the styrene fraction varies from about 0.48 to about 0.76, from about 0.51 to about 0.62, from about 0.58 to about 0.62, and from about 0.63 to about 0.73. However, other ranges are possible.

In the disclosed structures, a diblock copolymer film is disposed over the crosslinked polymer film. The diblock copolymer film defines a pattern, which is produced by the self-assembly of the diblock copolymer induced by the underlying crosslinked polymer film. The characteristics of the pattern may vary. In some embodiments, the pattern comprises domains oriented perpendicular with respect to the surface of the substrate. In other embodiments, the pattern further comprises domains oriented parallel with respect to the surface of the substrate. The domains themselves may comprise a variety of molecular structures. In some embodiments, the domains comprise cylinders. In other embodiments, the domains comprise lamellae. Finally, by "perpendicular" it is meant that the molecular structures within the domains form an approximate, but not necessarily exact, right angle with the surface of the substrate. Similarly, the term "parallel" is meant to encompass molecular structures which are oriented approximately parallel to the surface of the substrate. As described in the Examples below, the pattern may be controlled by the composition and thickness of the crosslinked polymer film as well as the composition of the diblock copolymer itself.

The diblock copolymer may be formed from a variety of copolymers. In some embodiments, the diblock copolymer comprises a polystyrene (PS)-polymethyl methacrylate (PMMA) copolymer. In such embodiments, the ratio of the polystrene to polymethylmethacrylate may vary. In some embodiments, the ratio is about 1 to 1 to provide a symmetric diblock copolymer. In other embodiments, enough PS is present to provide an asymmetric PMMA cylinder forming diblock copolymer. In yet other embodiments, enough PMMA is present to provide an asymmetric PS cylinder forming copolymer. Specific, exemplary compositions are provided in the Examples below.

Because the crosslinking of the random copolymer neither depends upon the identity of the substrate nor requires high temperatures, a variety of substrates may be used in the disclosed structures. The use of spin coating of the random copolymer also allows the use of a wide variety of substrates. Exemplary substrates include, but are not limited to silicon, glass, ITO-coated glass, gold, magnesium oxide, and platinum.

The present invention also discloses methods for forming the structures described above. Briefly, the methods involve coating a substrate with a solution comprising a random copolymer polymerized from a first monomer, a second monomer, and a third, photocrosslinkable monomer. The third monomer may also be thermally-crosslinkable. Next, the coated substrate is exposed to UV light, which induces crosslinking in the random copolymer to provide a crosslinked polymer film disposed over the substrate. In some embodiments, the coated substrate is exposed to UV light through a photomask. As further described in Example 1, below, the photomask may be used to photo-pattern alternate regions of preferential and neutral wetting on the coated substrate by inducing crosslinking of the random copolymer only in those regions exposed to UV light. The solution comprising the random copolymer may have other components, including, but not limited to a photoinitiator and/or a photo-acid generator. Vinyl acrylates or vinyl ethers are non-limiting examples of suitable photoinitiators. BDSDS/PTPDS is a non-limiting example of a suitable photoacid generator.

The methods may further comprise other steps. For example, in some embodiments, the coated substrate is thermally annealed after exposure to UV light. In other embodiments, the methods further comprise coating the crosslinked polymer film with a solution comprising a diblock copolymer and thermally annealing the coated crosslinked polymer film to provide a patterned diblock copolymer film disposed over the crosslinked polymer film. Details of these methods and other methods are further provided in the Examples below.

The present invention, thus generally described, will be understood more readily by reference to the following examples, which are provided by way of illustration and are not intended to be limiting of the present invention.

EXAMPLES

Example 1

Orientation of Symmetric Diblock Copolymers on Crosslinked Copolymer Films Formed from Random Copolymers Containing Either Acrylovl Groups or Glycidyl Groups In the acronyms used below, "P" stands for polymer, "H" stands for HEMA, "A" stands for acryloyl, "G" stands for glycidyl and "2" represents the mole % of H, A, or G in the copolymer.

Materials. P(S-r-MMA-r-HEMA) (PH2) was synthesized by the previously reported method in Ryu et al., *Science* 2005, 308, 236. PA2 was synthesized by the esterification of PH2 in anhydrous THF with excess acryloyl chloride using triethyl amine as a base. PG2 was synthesized by a similar procedure as PH2 by using glycidyl methacrylate (GMA) instead of HEMA as a comonomer. The resulting highly viscous mixture was diluted with THE and precipitated into methanol. The precipitate was filtered and dried under reduced pressure to obtain PA2 (Mn 27 000, PDI 1.18) or PG2 (Mn 31 000, PIN 1.24) copolymer as a white solid.

A symmetric poly(styrene)-block-poly(methyl methacrylate) P(S-b-MMA) diblock copolymer (MBw: 104 kg mo-l, $f\beta_{st}$:~0.5, PDI:1.05) was purchased from Polymer Source Incorporation and used without further purification.

Prior to film casting, silicon (100) substrates were cut into 1.5 cm pieces (or used without cutting), and cleaned in a toluene bath under sonication for 3 min. The substrates were then washed with toluene, acetone, and ethanol and dried in a stream of nitrogen, :Following the precleaning steps, the substrates were piranha cleaned with a mixture of $H_2O_2$ (30%)/$H_2SO_4$ (70%) (v/v) at 80° C. for 30 min (CAUTION! May cause explosion in contact with organic material!) and rinsed with distilled water and dried in a stream of nitrogen. The thickness of the native oxide layer was 1.6 nm. Other cleaning methods may be used for other substrates. By way of example only, gold substrates may be simply washed with deionized water.

Surface modification and block copolymer deposition. FIG. 1 illustrates the modification of substrate surfaces with photo-crosslinked. PA2 (A) and photo-crosslinked PG2 (B). Photo-crosslinked PA2 film was generated by spin-coating PA2 (0.3 wt %) solution in cyclopentanone containing 2 wt % of vinyl acrylate at 4000 rpm onto the clean silicon substrate followed by UV exposure (600 mJ $cm^2$). Photo-crosslinked PG2 films were fabricated by spin-coating of 0.3 wt % PG2 solution in cyclopentanone containing 2.5 wt % of BDSDS/PTPDS onto the clean silicon substrate, followed by UV exposure (100 mJ $cm^2$), and post exposure bake at 130° C. for 30 min. For both PA2 and PG2 any uncross linked random copolymer was removed by repeated washing in cyclopentanone and toluene resulting in crosslinked PG2 film. The photo-crosslinking of PA2 or PG2 films were carried out in a Spectrolinker XL-1500 UV crosslinker (254 nm) from Spectronics Corporation. On the PA2 or PG2 modified substrate, P(S-b-MMA) was spin-cast from 1.5 wt % toluene solution at 4000 rpm resulting in 40 nm thick BCP films. The samples were annealed in vacuum at 190° C. for 72 h and subsequently cooled to room temperature. Surface modification and block copolymer deposition is similar for other types of substrates.

Photopatterning. A PA2 film deposited on a silicon substrate by spin-coating from a 0.3 wt % solution of PA2 containing 2 wt % vinyl acrylate was photopatterned by exposure to 600 mJ $cm^{-2}$ UV through a 200 mesh TEM grid (PELC00®, Pitch 127 µm, Hole Width 90 µm; Bar Width 37 µm) as a photomask. A PG2 film deposited on a silicon substrate by spin-coating from a 0.5 wt % solution in cyclopentanone containing 40 wt % of BDSDS/PTPDS was photo-patterned by exposure to 100 mJ $cm^{-2}$ of UV through a 200 mesh TEM grid as a photomask. Post exposure bake was done at 120° C. for 30 min. Uncrosslinked random copolymer was removed by repeated washing in cyclopentanone and toluene resulting in patterned PA2 or PG2 films on silicon substrate.

Characterization. Thickness of the crosslinked copolymer film and the block copolymer film was measured with a Rudolph Research ellipsometer using a helium-neon laser (λ=633 nm). Scanning electron microscope (SEM) images of block copolymer thin films were obtained with a LEO 1550 VP field-emission SEM.

Results. Efficiency of the photo-crosslinking process for PA2 and PG2 was evaluated in the presence of a photoinitiator and a photoacid generator respectively. Vinylacrylate was used as a photoinitiator as it is structurally similar to the reactive groups in PA2. The photo-crosslinking of vinyl groups in PA2 with and without photoinitiator was studied by measuring the remaining thickness of crosslinked films following UV exposure (254 nm) at room temperature followed by washing with cyclopentanone and toluene under sonication to remove any uncrosslinked chains. Spincasting of 0.3 wt % toluene solution of PA2 produced 13 nm thick films over piranha cleaned silicon substrate. The remaining thickness of the crosslinked PA2 film was approximately 2.5 rim (19% of the original thickness with UV exposure of 800 mJ cm$^{-2}$. It is noted that UV exposure at doses>1000 mJ cm$^{-2}$ may degrade the PMMA segments in the polymer. Hence, to increase the effectiveness of photo-crosslinking process 2 wt % of vinyl acrylate was included in the PA2 solution as a photoinitiator before exposure. The remaining thickness increased to 3.6 nm (28% of the original thickness) after UV exposure for the same duration on inclusion of photoinitiator. Thickness of the crosslinked films can be easily controlled by changing the initial concentration of PA2 solution. For example, 1.0 wt % of PA2 in toluene resulted in a 15 nm (30% of the original thickness) crosslinked film following exposure to 600 mJ cm$^{-2}$ of UV light.

An alternate photo-crosslinkable random copolymer system PG2 having crosslinkable epoxy groups was also examined. This system requires a smaller UV exposure dose than for crosslinking PA2, which is desirable for general lithography. The epoxy groups in the random copolymer are easily crosslinked with the help of photogenerated acids during UV exposure. Photo-crosslinked PG2 films were fabricated by depositing a PG2 solution having 2 wt % of BDSDS/PTPDS as a photo-acid generator (PAG) onto the clean silicon substrate. Spin-coating of 0.3 wt % solution in cyclopentanone at 4000 rpm gave ~16 nm thick films. Following UV exposure, post-exposure bake (PEB) was done at 130° C. for 30 min. Any uncrosslinked random copolymer was removed by repeated washing in cyclopentanone and toluene. Typically a 50 mJ cm$^{-2}$ exposure resulted in a 6.5 nm (40% of original thickness) thick photo-crosslinked film. The calculated sensitivity of PG2 system was 50 mJ cm$^{-2}$, which is significantly higher than the PA2 system.

Figure 2:
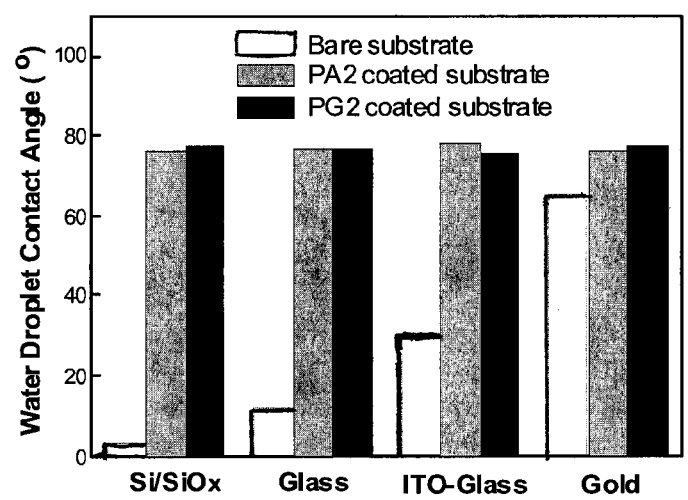
FIG. 2 shows a bar chart presenting the measured water contact angles before and after modification of $Si/SiO_x$, glass, ITO, and gold substrates with photo-crosslinked PA2 or PG2 thin films. The measured contact angle on all the modified substrates is approximately constant.

As shown in FIG. 2, photo-crosslinking of spin-coated PA2 or PG2 thin films resulted in a modified substrate which showed a constant contact angle between 76-78° on all the substrates tested such as glass, indium tin oxide (ITO)-coated glass, silicon, and gold coated silicon. Moreover, the ultra-thin (2-6 nm) crosslinked films showed superior stability as they could not be removed by heating and sonication in organic solvents for several days. As described above, this ultra-thin imaging layer is a desirable feature for effective pattern transfer.

Figure 3:
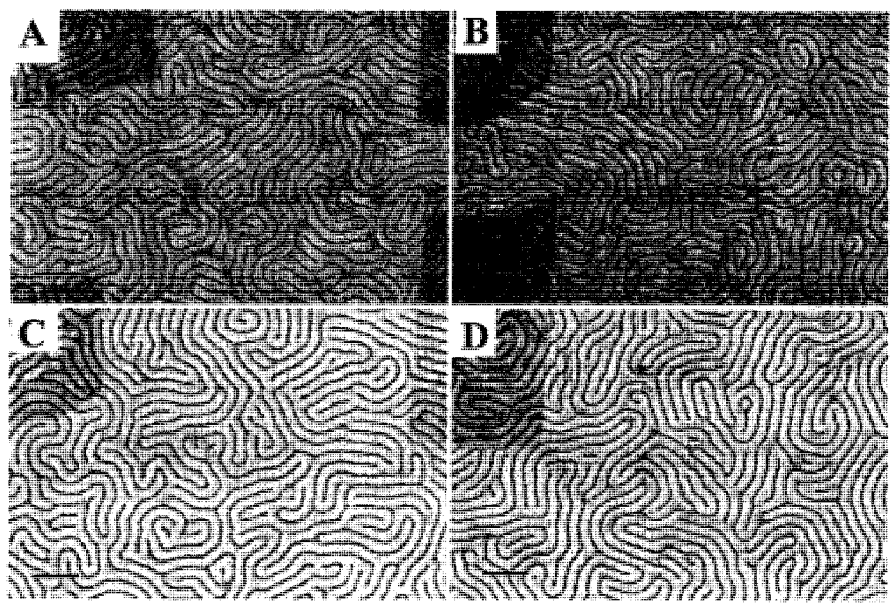
FIG. 3 shows SEM images of symmetric PS-b-PMMA diblock copolymer on: (A) PA2 modified silicon substrate; (B) PA2 modified Au coated silicon substrate; (C) PG2 modified silicon substrate; and (D) PG2 modified gold coated silicon substrate showing vertically oriented lamellae. The scale bar corresponds to 200 nm.

A 40 nm-thick symmetric P(S-h-MMA) copolymer film [104 kg mol-1; Lo (bulk), ~48 nm; $f_{st}$~0.5] was spin-coated over photo-crosslinked PA2 (3.6 nm) or PG2 layer (6.5 nm). Following thermal annealing in vacuum at 190° C. for 72 h, the resulting orientation of the domains was examined by scanning electron microscopy (SEM). As shown in FIGS. 3A and B, vertically oriented lamellas were observed by SEM on PA2 modified silicon and Au substrates. The inclusion of small amount of a third photosensitive monomer in the random copolymer did not significantly alter the wetting properties of the random copolymer layers. Chemically, acryloxy-ethyl methacrylate is similar to methyl methacrylate and the combined fraction of both monomers adds up to 0.42, As shown in FIGS. 3C and D, PG2 was equally effective in inducing vertical orientation of lamella on both silicon and gold substrates.

Figure 4:
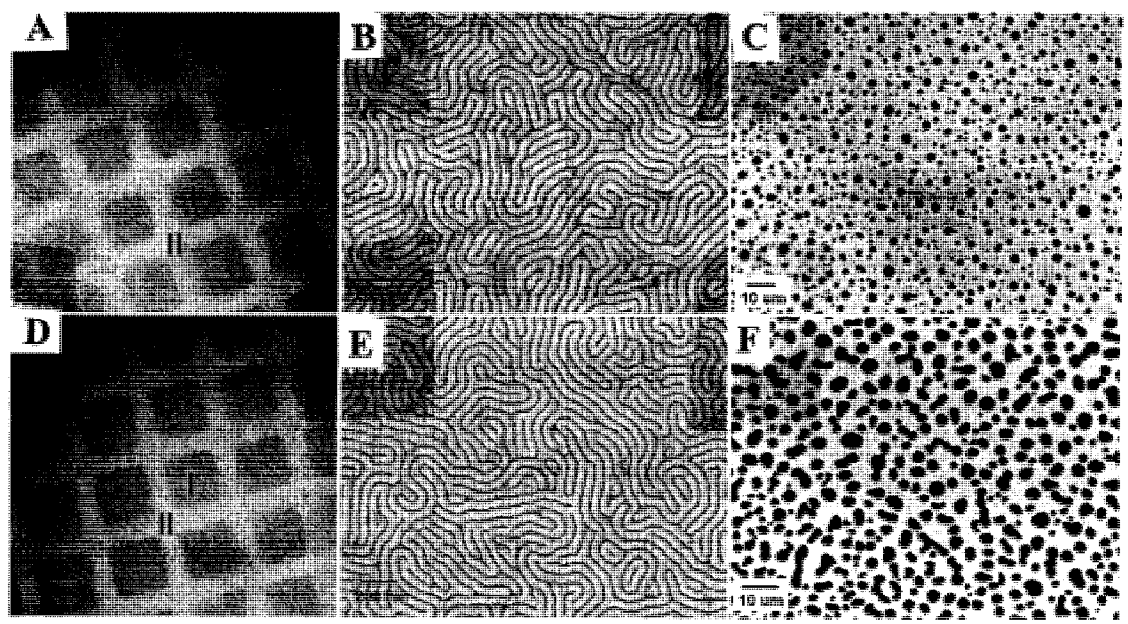
FIG. 4 shows representative images of a block copolymer thin film deposited and thermally annealed on a photo-patterned (A) PA2, and (1)) PG2 film. High-resolution SEM images showing vertical lamella in the exposed region (region I) on patterned (B) PA2, and (E) PG2 film, and unexposed region (region II) showing hole/island on patterned (C) PA2 and (F) PG2 film.

As both PG2 and PA2 are photo-crosslinkable, it is possible to photo-pattern alternate regions of preferential and neutral wetting on substrates coated with the relevant random copolymers. A PA2 film was patterned by exposure to UV irradiation (254 nm) through a TEM grid as a photo-mask. Successive washing with cyclopentanone and toluene resulted in preferential and neutral wetting regions over unexposed and exposed regions, respectively, on silicon substrate. The unexposed PA2 film showed a residual thickness of 0.4 nm and water contact angle of 32° following the washing step. FIG. 4A shows the SEM image of a thin film of symmetric P(S-h-MMA) deposited and annealed on the patterned PA2 film. The exposed regions I (the rectangles in SEM image) and the unexposed regions II (the Cu grid region in the images) of patterned PA2 film resulted in vertical and parallel orientation, respectively, of the BCP lamellar domains. The characteristic hole/island morphology for parallel lamella orientation is apparent in the SEM micrograph of the unexposed region (FIG. 4C). Vertical lamella morphology in the exposed regions is clearly observed in the high resolution SEM images (FIG. 4B). Examination of BCP morphology in various regions of the patterned substrate, i.e., the unexposed and unexposed region by SEM shows clear transition from vertical to parallel lamellas. The width of the transition region itself varied from sample to sample as it depends on a number of factors such as the distance between the TEM grid and the substrate, and the interaction of the grid with the UV light itself.

PG2 cross-links through the acid catalyzed ring opening mechanism via a PAG. PG2 film containing 2.5 PAG was patterned by exposure to 100 mJ cm$^{-2}$ of UV through a mask, followed by a PEB step of 130° C. for 30 minutes and washing. Depositing a BCP film on the above patterned substrate resulted in vertical lamellae instead of hole and island even in the unexposed region indicating the presence of a crosslinked PG2 film even after washing. This is most likely due to the thermal crosslinking of epoxy groups to the substrate during the PEB process. Therefore, for effective patterning of the PG2 system the PEB step was optimized along with the amount of PAG. In order to minimize the thermal crosslinking of PG2 to the substrate, the amount of PAG in the PG2 solution was increased to 40 wt % and the PEB was reduced to 120° C. for 30 minutes. A thin film of symmetric P(S-b-MMA) was deposited and annealed on the patterned PG2 film. The exposed regions I (the rectangles in SEM image) and the unexposed regions II (the Cu grid region in the images) of patterned PG2 film resulted in vertical (FIG. 4E) and parallel orientation of the BCP lamellar domains respectively (FIG. 4F). Because the PG2 system has higher sensitivity and can crosslink by both a photochemical and a thermal process, effective patterning of PG2 involves an optimization of processing conditions so that thermal crosslinking to the substrate is minimized during the PEB process.

Example 2

Orientation of Asymmetric and Symmetric Diblock Copolymers on Crosslinked Copolymer Films Formed from Random Copolymers Containing Either Hydroxyl Groups or Glycidyl Groups The phrase "perpendicular window" below refers to the composition range (as measured by the actual styrene fraction, $F_{st}$) of the random copolymer that is capable of orienting block copolymer domains perpendicular to the surface.

Materials. Styrene (St), methyl methacrylate (MMA), glycidyl methacrylate (GMA) and 2-hydroxyethyl methacrylate (HEMA) were purchased from Aldrich and distilled under reduced pressure. Initiator I,[23] and initiator II[24] were synthesized according to the literature. Ghani, M. A. A. et al., *Canadian Journal of Chemistry-Revue Canadienne De Chimie* 2004, 82 (9), 1403-1412; and Benoit, D., et al., *Journal of the American Chemical Society* 1999, 121 (16), 3904-3920. Three block copolymers were purchased from Polymer Source Incorporated (Dorval, Quebec, Canada) and used without further purification: symmetric P(S-b-MMA) (PS 52 kg/mol, PMMA 52 kg/mol, polydispersity index (PDI), 1.09, lamellar period $L_0$=49 nm), asymmetric PMMA cylinder forming P(S-b-MMA) (PS 50.5 kg/mol, PMMA 20.9 kg/mol, PDI, 1.06, lattice spacing $L_0$=43 nm), and asymmetric PS cylinder forming P(S-b-MMA) (PS 20.2 kg/mol, PMMA 50.5 kg/mol, PDI, 1.07, $L_0$=40 nm). These three block copolymers are referred to throughout as L5252, PMMA-05020 and PS-C2050, respectively.

Synthesis of copolymers. Below, "PH" refers to a PS and PMMA random copolymer with 1% HEMA in the main chain, and "PG1" refers to a PS and PMMA random copolymer with 1% GMA in the main chain. "Terminal-OH" refers to the hydroxyl-terminated P(S-r-MMA). The amount of the third monomer (HEMA or GMA) was fixed at 0.01 mole fraction and the styrene fraction was varied from 0.45 to 0.80.

Figure 5:
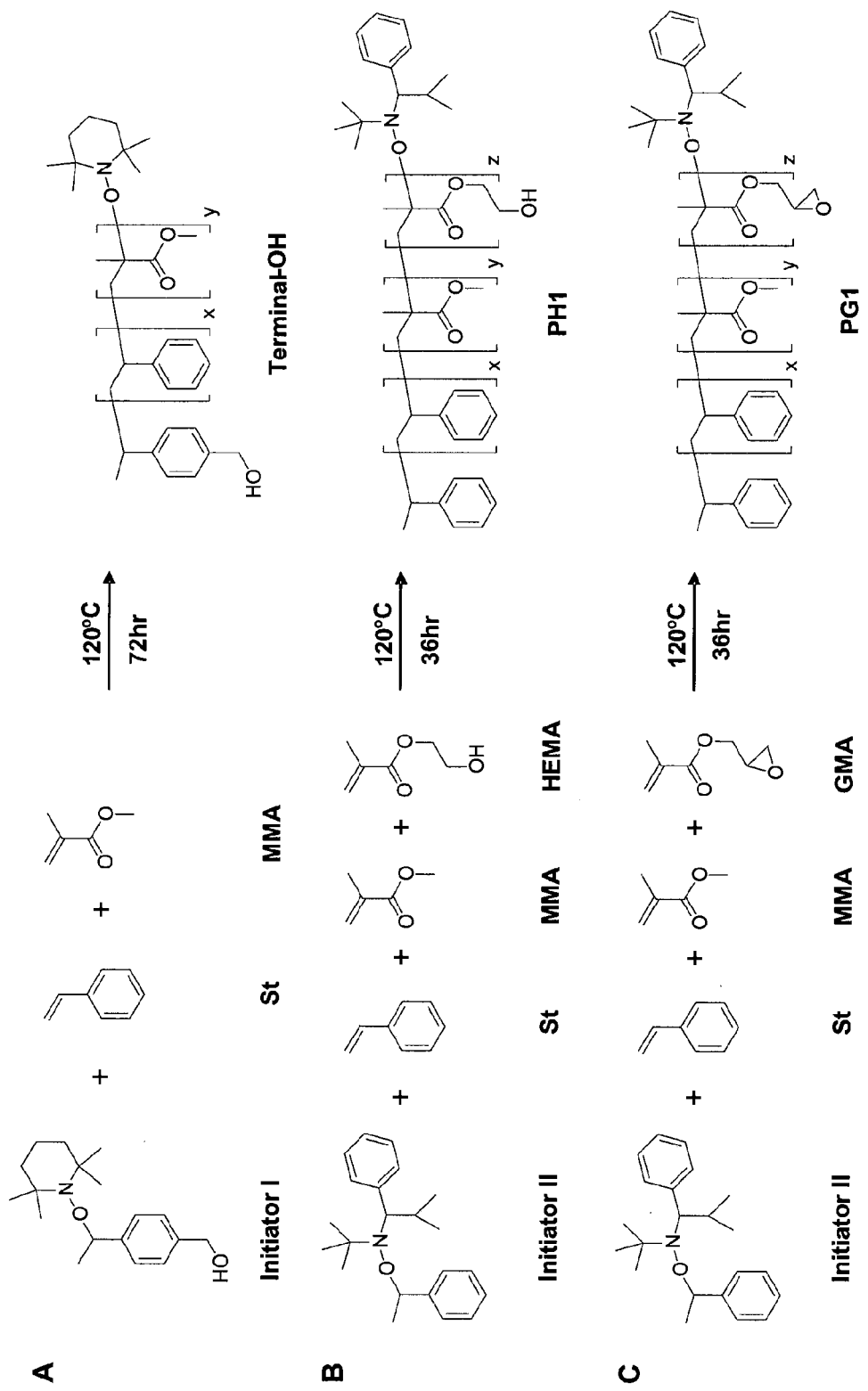
FIG. 5 shows the reaction schemes for the formation of PS/PMMA random copolymers: (A) hydroxyl terminated random copolymer (terminal-OH), (B) side-chain hydroxy-containing random copolymer (P1:11), and (C) side-chain epoxy-containing random copolymer (PG1).

All random copolymer samples were synthesized by nitoxide-mediated living free radical polymerization (NMP) following similar procedures. The synthesis scheme is shown in FIG. 5. A representative procedure is as follows: For one sample of PH1, a mixture of initiator II (0.02 g, 0.061 mmol), St (2.46 g, 23.6 mmol), MMA (1.29 g, 12.9 mmol), and HEMA (0.0479 g, 0.369 mmol) was degassed by three freeze/thaw cycles and sealed under nitrogen. The polymerization mixture was reacted at 120° C. for 36 h. (For terminal-OH synthesis, the polymerization lasted 72 h.) The resulting viscous mixture was diluted with THF and precipitated into methanol. The precipitated solid was filtered and dried under reduced pressure to yield the random copolymer PH1 as a white solid.

Characterization. For each synthesized random copolymer, a $^1$H NMR spectrum was recorded in solution (CDCl$_3$) with a Bruker AC+300 (300-MHz) spectrometer, with the tetramethylsilane (TMS) proton signal as an internal standard. GPC was performed with a Viscotek GPCmax VE-2001 chromatograph using two columns (VARIAN 5M-POLY-008-27 and VARIAN 5M-POLY-008-32) and Viscotek Model 302 TDA detectors. THF was used as an eluent with 1 mL/min flow rate at 30° C. Monodisperse polystyrene standards were used for calibration. Molecular weights were determined as polystyrene equivalents using the refractive index detector. The film thicknesses of the brush and block copolymer layers were measured by ellipsometry (Rudolph Research Auto EL). Static contact angles of sessile drops were measured to characterize the hydrophilicity of the surface layers with a Dataphysics OCA 15 Plus goniometer. Top-down scanning electron microscope (SEM) images of the block copolymer microdomains were acquired with a LEO-1550 VP field-emission instrument using an accelerating voltage of 1 kV and a 30 μm aperture.

Surface Modification and Block Copolymer Deposition. For the terminal-OH brush, solutions of terminal-OH in toluene (1% w/w) were spin coated at 2000 rpm onto silicon wafers and then annealed under vacuum at 160° C. for 2 days. The substrates were sonicated in hot toluene to remove un-grafted random copolymer and rinsed with fresh toluene. For the PH1 brush, solutions of PH1 in toluene (1% w/w) were spin coated at 4000 rpm onto silicon wafers and then annealed under vacuum at 160° C. for 2 days. The substrates were sonicated in hot toluene to remove un-grafted random copolymer and rinsed with fresh toluene. For the PG1 mat, solutions of PG1 in toluene (0.5% w/w) were spin coated at 4000 rpm onto silicon wafers and then annealed under vacuum at 160° C. for 2 days. The substrates were sonicated in hot toluene to remove random copolymer that was not crosslinked and rinsed with fresh toluene.

On these random copolymer modified wafers, solutions of lamellae-forming L5252 in toluene (1.5% w/w), PMMA-cylinder-forming PMMA-C5020 in toluene (1% w/w), or PS-cylinder-forming PS-C2050 in cyclopentanone (1% w/w) were spin-coated at 4000 rpm to produce films with thicknesses of 45 nm, 32 nm, and 22 nm, respectively. Since the quality of perpendicular structures is dependent on the block copolymer film thickness and annealing temperature as well as the random copolymer composition, the block copolymer film thickness and annealing temperature were held constant to isolate the brush effects. All block copolymer films were annealed at 190° C. for 72 h under vacuum to attain the equilibrium morphology prior to imaging.

Film thickness was chosen to permit formation of perpendicularly oriented domains. In the case of the lamellar domains of L5252 ($L_0$=49 nm), the film thickness was set to $\sim L_0$, which has yielded perpendicular structures previously[2,26] and is well below the thickness limit for perpendicular structures found by others. Stoykovich, M. P. et al, *Materials Today* 2006, 9(9), 20-29; Liu, C. C., et al., *Journal of Vacuum Science Technology B* 2007, 25 (6), 1963-1968; Edwards, E. W., et al., *Advanced Materials* 2004, 16 (15), 1315-1316; and Xu, T., et al., *Macromolecules* 2005, 38 (7), 2802-2805. In addition, this is near the optimal thickness reported by Ham, S., et al. in *Macromolecules* 2008, published on web on Aug. 6, 2008. For PMMA-C5020, 32-nm-thick films were made, based on results that the best film thickness for the formation of perpendicular cylinders is slightly below $L_0$ of the block copolymer. Jeong, U. et al., *Advanced Materials* 2004, 16 (6), 533-536; Ham, S., et al., *Macromolecules* 2008, published on Web Aug. 6, 2008; and Guarini, K. W., et al., *Advanced Materials* 2002, 14 (18), 1290-129. For PS-C2050, a range of film thicknesses was studied of which perpendicular structures could only be produced with a 22 nm thick film. As discussed below, an increase in the film thickness of PS-C2050 ($L_0$=40 nm) on terminal-OH from 22 mm to 31 nm effectively closed the perpendicular window for this block copolymer.

Polymer Characteristics. The $M_n$ of the terminal-OH copolymers was in the range of 2000 to 7500 g/mol, with PDI values of 1.2 to 1.4, whereas the $M_n$ of PH1 and PG1 were in the range of 60,000 to 70,000 g/mol, with PDI values of ~1.2. The feed ratios ($f_{st}$) of the styrene monomers ranged from 0.45 to 0.76 for PH1; from 0.45 to 0.78 for PG1; and from 0.40 to 0.70 for terminal-OH. The actual styrene fraction ($F_{st}$) in the resulting PHI, PG1, and terminal-OH copolymers was measured by $^1$H NMR. A small difference between the fsr and $F_{st}$ was observed in most cases, which was probably caused by slight variations in the batch size during polymerization or by slightly less than complete conversion of reactants. In this example, the composition of each copolymer is referred to by its $F_{st}$ value, and not $f_{st}$, as $F_{st}$ reflects the composition of the final material.

Figure 6:
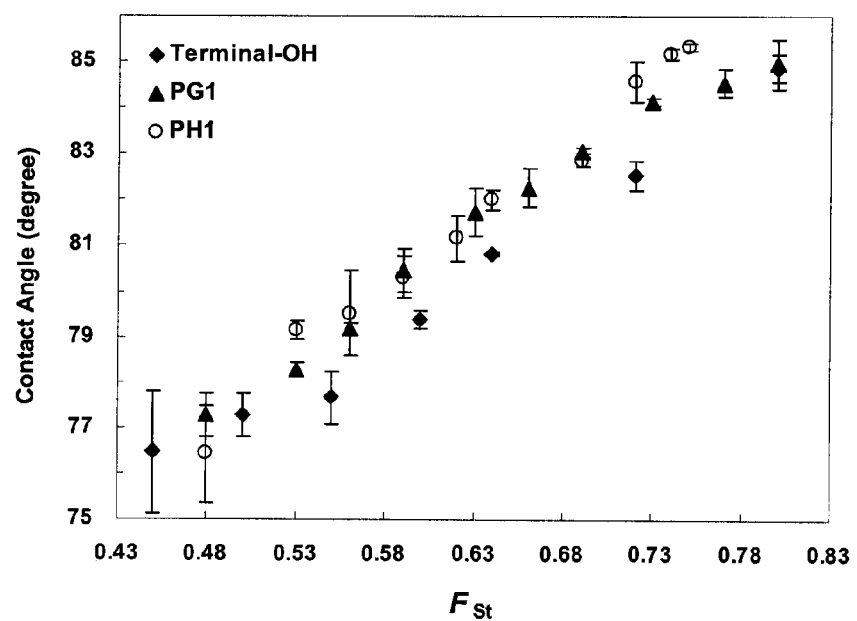
FIG. 6 shows contact angles for water on the terminal-OH, PH1 and PG1 modified surfaces as a function of $F_{st}$ (defined in the Examples). Error bars show the standard deviation of each measurement.

Surface-Layer Properties. After covalently grafting PH1 or terminal-OH to the substrate, the resulting brush thickness was ~8 nm or in the range of 3-6 nm, respectively. In contrast with the terminal-OH, the thicknesses of the crosslinked mats like PG1 were a function of the amount of material initially spin coated onto the substrate. PG1 films were produced that were measured to be ~8 nm-thick after crosslinking and sonication in solvent, which was sufficiently thick to prevent any interactions between the block copolymer film and the substrate. Water contact angles were measured for the films as a means to assess the uniformity and composition of each film. In all cases, the hydrophilicity of each random copolymer was a function of its molecular composition, as shown in FIG. 6. While the contact angles of the PH1 and PG1 were very similar except at high $F_{st}$, the contact angles for the terminal-OH-coated substrates were consistently ~1° lower than for those substrates coated with PH1 or PG1 at a given $F_{st}$.

Figure 7:
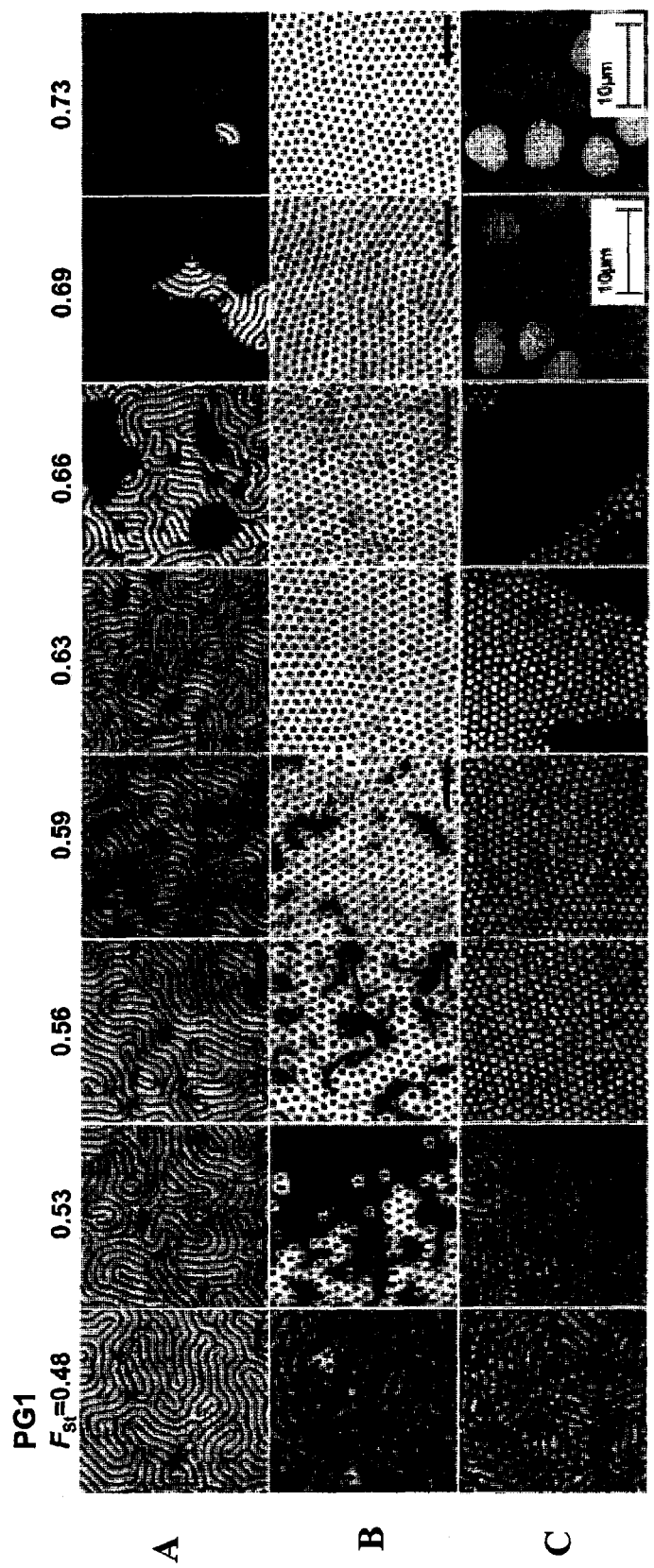
FIG. 7 shows SEM images of self-assembled block copolymer films on a PG1 modified surface containing different mole fractions of styrene in the random copolymer: (A) L5252, 45 nm thick, (B) PMMA-05020, 32 nm thick, and (C) PS-C2050, 22 nm thick. These block copolymer films are defined in the Examples. Black scale bars represent 200 nm. For image clarity, only a subset of $F_{st}$, is shown.

Dependence of Block Copolymer Domain Orientation on Surface Layer Composition. L5252, PMMA-C5020 and PS-C2050 were spin coated and annealed over the random copolymer-modified substrates (terminal-OH, PH1, and PG1). Each sample was imaged with SEM to determine the orientation of the domains. FIG. 7 shows representative SEM images for the samples coated on PG1: L5252 (A), PMMA-C5020 (B), and PS-C2050 (C). Perpendicular orientation of lamellae in L5252 was achieved on the PG1 mat where $0.51 \leq F_{st} \leq 0.62$. For $0.63 \leq F_{st} < 0.73$, dark spots were observed in the L5252 film, indicating regions of parallel orientation. The size of these regions increased as $F_{st}$ increased. In general, for substrate compositions that were between those compositions that yielded completely perpendicular or parallel domain orientation, a mixed morphology was observed, with some domains oriented perpendicular to the substrate and some parallel. For the mixed morphology, the parallel structures are referred to as "defects." The appearance of defects delineates the lower and upper limits of surface composition to produce uniform perpendicular orientation of the block copolymer domains.

Figure 8:
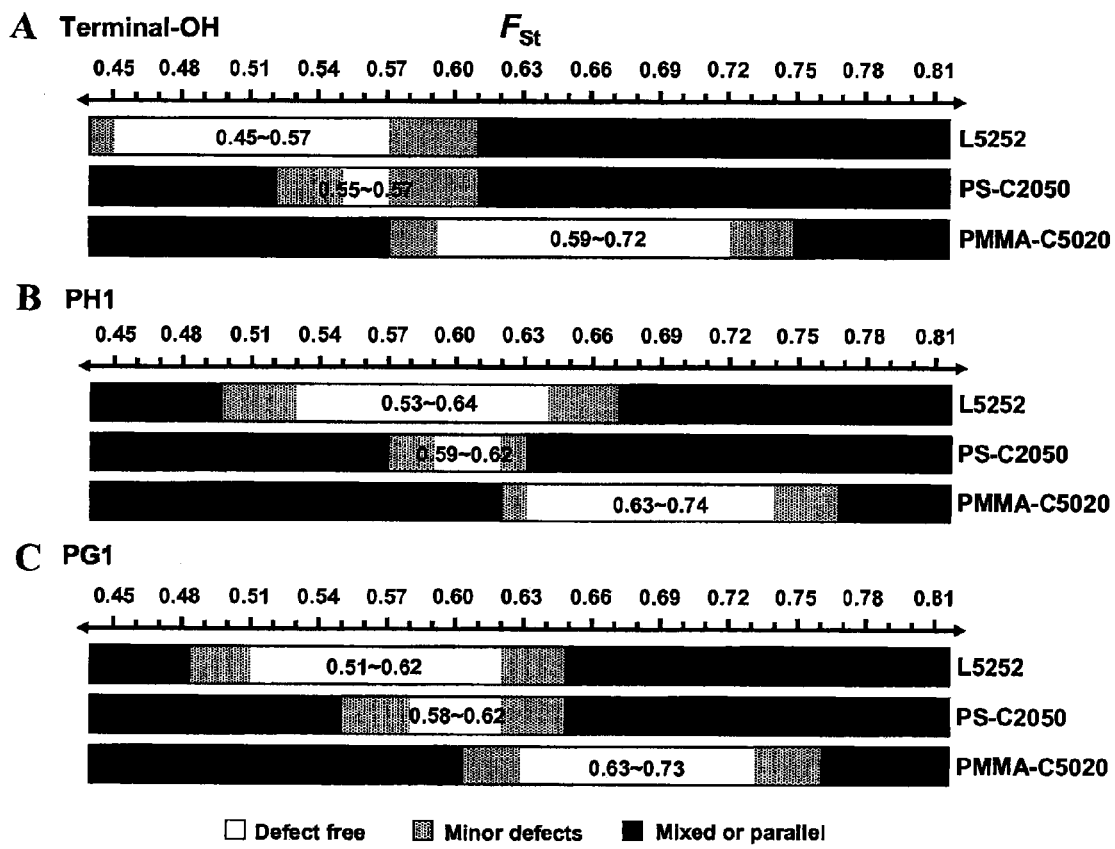
FIG. 8 shows the perpendicular windows of terminal-OH (A), PH1 (B), and PG1 (C) for symmetric and asymmetric block copolymers, L5255, PMMA-05020, and PS-C205.

A different perpendicular window was observed for block copolymer cylinders than for lamellae on PG1. Between $0.63 < F_{st} \leq 0.73$, PMMA-C5020 assembled into vertically oriented structures. The vertical orientation was at significantly higher $F_{st}$ than for the lamellae-forming L5252. At a composition of the mat outside of this range, defects were seen in the structure that could be either bridging between cylinders (loop structures) or cylinders parallel to the free surface. PS-C2050 showed vertically oriented structures only between $0.58 \leq F_{st} \leq 0.62$, a significantly narrower window than for the other block copolymers. Even at this narrow range of compositions, the quality of vertical cylinders was not perfect and some bridging was observed. Only the perpendicular windows for lamellae and PS cylinders overlapped, as shown in FIG. 8C. Similar analyses were repeated with both terminal-OH and PH1 modified substrates. Although the SEM images for these substrates are not shown, the perpendicular windows are summarized in FIGS. 8A and 8B. As shown in FIG. 8, for PH1 and PG1, the perpendicular windows for all three block copolymers were shifted towards higher $F_{st}$, compared to the terminal-OH brushes.

The preceding results focus on brush and mat layer composition. The range of $F_{st}$ that resulted in perpendicular structures also depended on the diblock copolymer film thickness. Increasing the thickness of the PS-C2050 block copolymer from 22-nm to 31-nm on terminal-OH brushes caused the perpendicular cylinders to form only over small areas (data not shown).

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above.

All publications, patent applications, issued patents, and other documents referred to in this specification are herein incorporated by reference as if each individual publication, patent application, issued patent, or other document were specifically and individually indicated to be incorporated by reference in its entirety. Definitions that are contained in text incorporated by reference are excluded to the extent that they contradict definitions in this disclosure.

For the purposes of this disclosure and unless otherwise specified, "a" or "an" means "one or more."

What is claimed is:

1. A structure comprising:
    a substrate;
    a crosslinked polymer film disposed over the substrate, the crosslinked polymer comprising a random copolymer polymerized from a first monomer, a second monomer, and a third monomer, wherein the third monomer is an epoxy-functional monomer or an acryloyl-functionalized monomer; and
    a diblock copolymer film defining a pattern disposed over the crosslinked polymer film;
    wherein the pattern is induced by the self-assembly of the diblock copolymer on the crosslinked polymer film.

2. The structure of claim 1, wherein the pattern comprises domains oriented perpendicular with respect to the surface of the substrate.

3. The structure of claim 2, wherein the domains comprise cylinders.

4. The structure of claim 2, wherein the domains comprise lamellae.

5. The structure of claim 1, wherein the crosslinked polymer film has a thickness of no greater than about 8 nm.

6. The structure of claim 1, wherein the first monomer comprises styrene, the second monomer comprises methyl methacrylate and the third monomer is an epoxy-functional monomer comprising glycidyl methacrylate.

7. The structure of claim 6, wherein the styrene fraction of the crosslinked polymer is from about 0.48 to about 0.76.

8. The structure of claim 7, wherein the random copolymer has a crosslinking density of at least about 1%.

9. The structure of claim 8, wherein the crosslinked polymer film has a thickness of no greater than about 8 nm.

10. The structure of claim 6, wherein the diblock copolymer comprises a polystyrene-polymethyl methacrylate copolymer.

11. The structure of claim 1, wherein the crosslinked polymer film comprises regions of crosslinked polymer and regions of uncrosslinked polymer, and further wherein the pattern comprises domains over the regions of crosslinked polymer that are oriented perpendicular with respect to the surface of the substrate and domains over the regions of uncrosslinked polymer that are oriented parallel with respect to the surface of the substrate.

12. A structure comprising:
a substrate;
a crosslinked polymer film disposed over the substrate, the crosslinked polymer comprising a random copolymer polymerized from styrene, methyl methacrylate and glycidyl methacrylate; and
a diblock copolymer film comprising a polymer polymerized from styrene and methyl methacrylate disposed over the crosslinked polymer film;
wherein the crosslinked polymer film produces a pattern in the diblock copolymer by inducing the self-assembly of the diblock copolymer, and further wherein the pattern comprises domains oriented perpendicular with respect to the surface of the substrate.

13. The structure of claim 12, wherein the styrene fraction of the crosslinked polymer is from about 0.48 to about 0.76 and the random copolymer has a crosslinking density of at least about 1%.

14. The structure of claim 13, wherein the crosslinked polymer film has a thickness of no greater than about 8 nm.

15. The structure of claim 1, wherein the first, second, and third monomers are styrene, methyl methacrylate, and an acryloyl-functional monomer.

16. The structure of claim 15, wherein the styrene fraction of the crosslinked polymer is from about 0.49 to about 0.77 and the diblock copolymer comprises a polystyrene-polymethyl methacrylate copolymer.

17. method comprising:
coating a substrate with a solution comprising a random copolymer polymerized from a first monomer, a second monomer, and a third monomer, wherein the third monomer is an epoxy-functional monomer;
exposing the coated substrate to UV light wherein the UV light induces crosslinking in the random copolymer to provide a crosslinked polymer film disposed over the substrate; and
coating the crosslinked polymer film with a solution comprising a diblock copolymer wherein self-assembly of the diblock copolymer is induced by the coated crosslinked polymer film to provide a patterned diblock copolymer film disposed over the crosslinked polymer film.

18. The method of claim 17, wherein the crosslinked polymer film has a thickness of no greater than about 8 nm and the random copolymer has a crosslinking density of at least about 1%.

19. The method of claim 17, wherein the first monomer comprises styrene, the second monomer comprises methyl methacrylate, and the epoxy-functional monomer comprises glycidyl methacrylate.

20. The method of claim 17, further comprising thermally annealing the coated substrate after the exposure to UV light.

21. The method of claim 17, wherein the coated substrate is exposed to UV light through a photomask.

22. The method of claim 17, wherein the diblock copolymer comprises a polystyrene-polymethyl methacrylate copolymer.

23. The structure of claim 1, wherein the crosslinked polymer film has a thickness of no greater than about 5 nm and the random copolymer has a crosslinking density of at least about 2%.

* * * * *